(12) United States Patent
Agarwal

(10) Patent No.: US 6,323,046 B1
(45) Date of Patent: Nov. 27, 2001

(54) METHOD AND APPARATUS FOR ENDPOINTING A CHEMICAL-MECHANICAL PLANARIZATION PROCESS

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/139,814

(22) Filed: Aug. 25, 1998

(51) Int. Cl.[7] ................................................. H01L 21/302
(52) U.S. Cl. ...................... 438/8; 438/9; 438/692; 438/705; 438/710; 216/60; 216/62; 216/85; 216/87
(58) Field of Search .................. 438/7, 8, 9, 10, 438/692, 705, 706, 710; 216/62, 59, 60, 61, 84, 85, 86, 87

(56) References Cited

U.S. PATENT DOCUMENTS

| | | | |
|---|---|---|---|
| 4,839,311 | * | 6/1989 | Riley et al. ........................... 437/228 |
| 5,036,015 | | 7/1991 | Sandhu et al. ........................... 437/8 |
| 5,294,289 | * | 3/1994 | Heinz et al. ........................... 156/626 |
| 5,559,428 | | 9/1996 | Li et al. ................................... 324/71.5 |
| 5,846,398 | * | 12/1998 | Carpio .................................. 205/775 |
| 6,060,358 | * | 5/2000 | Bracchitta ............................. 438/259 |
| 6,080,670 | * | 6/2000 | Miller et al. ........................... 438/691 |

FOREIGN PATENT DOCUMENTS

| | | | |
|---|---|---|---|
| 10-242089 | * | 9/1989 | (JP) . |
| 06-302570 | * | 10/1994 | (JP) . |
| 08-064561 | * | 3/1996 | (JP) . |
| 10-064859 | * | 3/1998 | (JP) . |

* cited by examiner

Primary Examiner—Gregory Mills
Assistant Examiner—George Goudreau
(74) Attorney, Agent, or Firm—Dorsey & Whitney LLP

(57) ABSTRACT

A method and apparatus for endpointing a planarization process of a microelectronic substrate. In one embodiment, the apparatus may include a species analyzer that receives a slurry resulting from the planarization process and analyzes the slurry to determine the presence of an endpointing material implanted beneath the surface of the microelectronic substrate. The species analyzer may include a mass spectrometer or a spectrum analyzer. In another embodiment, the apparatus may include a radiation source that directs impinging radiation toward the microelectronic substrate, exciting atoms of the substrate, which in turn produce an emitted radiation. A radiation detector is positioned proximate to the substrate to receive the emitted radiation and determine the endpoint by determining the intensity of the radiation emitted by the endpointing material. The endpointing material may be selected to be easily detected by the species detector or the radiation detector, and may further be selected to be easily distinguishable from a matrix material that comprises the bulk of the microelectronic substrate.

87 Claims, 5 Drawing Sheets

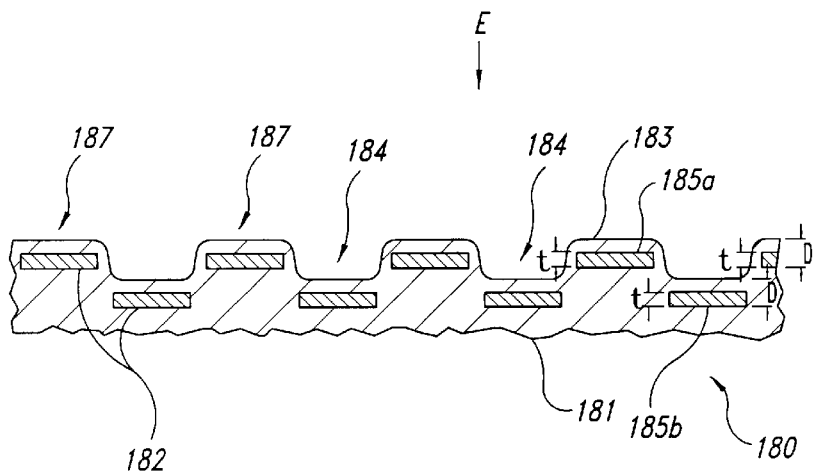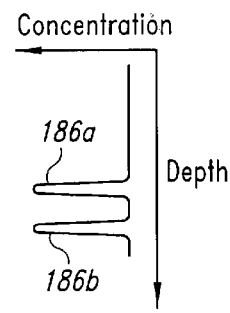
*Fig. 3A*  *Fig. 3B*
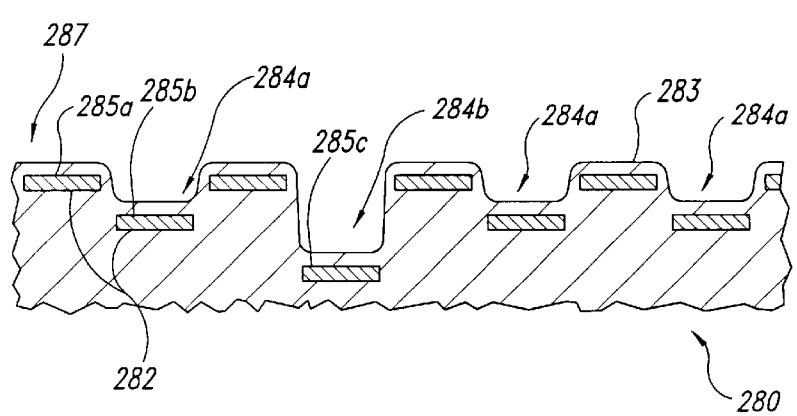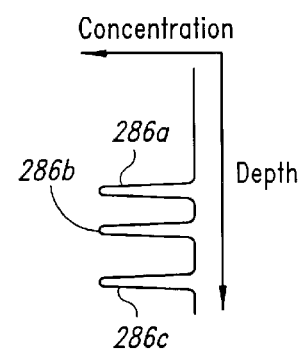
*Fig. 4A*  *Fig. 4B*

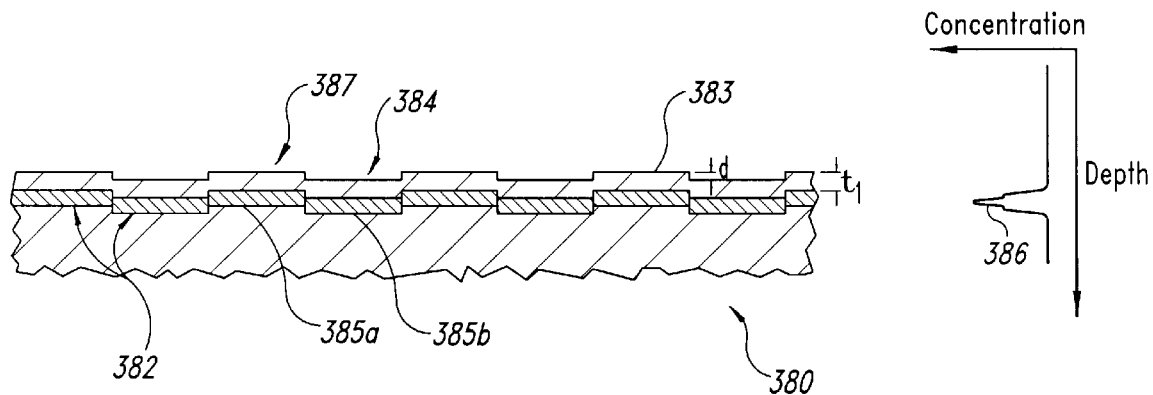
*Fig. 5A*  *Fig. 5B*
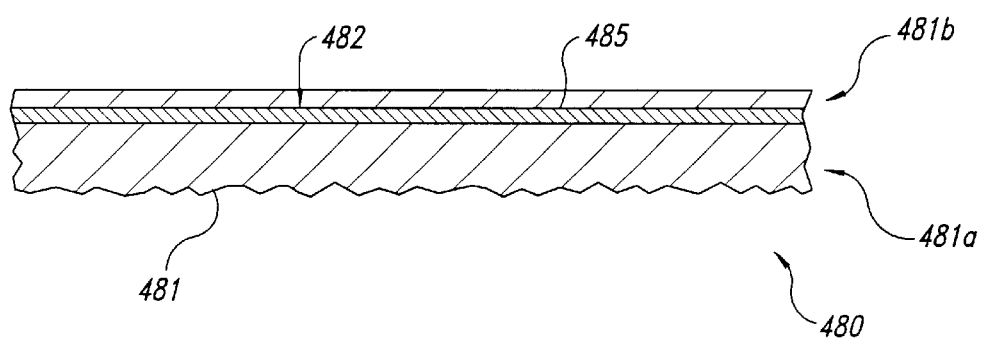
*Fig. 6*

METHOD AND APPARATUS FOR ENDPOINTING A CHEMICAL-MECHANICAL PLANARIZATION PROCESS

TECHNICAL FIELD

The present invention relates to methods and apparatuses for endpointing a chemical-mechanical planarization process.

BACKGROUND OF THE INVENTION

Mechanical and chemical-mechanical planarizing processes (collectively "CMP") are used in the manufacturing of microelectronic devices for forming a flat surface on semiconductor wafers, field emission displays and many other microelectronic substrates. FIG. 1 schematically illustrates a planarizing machine 10 with a platen or table 20, a carrier assembly 30, a polishing pad 21, and a planarizing fluid 23 on the polishing pad 21. The planarizing machine 10 may also have an under-pad 25 attached to an upper surface 22 of the platen 20 for supporting the polishing pad 21. In many planarizing machines, a platen drive assembly 26 rotates (arrow A) and/or reciprocates (arrow B) the platen 20 to move the polishing pad 21 during planarization.

The carrier assembly 30 controls and protects a substrate 80 during planarization. The carrier assembly 30 typically has a substrate holder 32 with a pad 34 that holds the substrate 80 via suction. A carrier drive assembly 36 typically rotates and/or translates the substrate holder 32 (arrows C and D, respectively). The substrate holder 32, however, may be a weighted, free-floating disk (not shown) that slides over the polishing pad 21.

The combination of the polishing pad 21 and the planarizing fluid 23 generally define a planarizing medium that mechanically and/or chemically-mechanically removes material from the surface of the substrate 80. The polishing pad 21 may be a conventional polishing pad composed of a polymeric material (e.g., polyurethane) without abrasive particles, or it may be an abrasive polishing pad with abrasive particles fixedly bonded to a suspension material. In a typical application, the planarizing fluid 23 may be a CMP slurry with abrasive particles and chemicals for use with a conventional nonabrasive polishing pad. In other applications, the planarizing fluid 23 may be a chemical solution without abrasive particles for use with an abrasive polishing pad.

To planarize the substrate 80 with the planarizing machine 10, the carrier assembly 30 presses the substrate 80 against a planarizing surface 24 of the polishing pad 21 in the presence of the planarizing fluid 23. The platen 20 and/or the substrate holder 32 then move relative to one another to translate the substrate 80 across the planarizing surface 24. As a result, the abrasive particles and/or the chemicals in the planarizing medium remove material from the surface of the substrate 80.

CMP processes must consistently and accurately produce a uniformly planar surface on the substrate to enable precise fabrication of circuits and photo-patterns. Prior to being planarized, many substrates have large "step heights" that create a highly topographic surface across the substrate. Yet, as the density of integrated circuits increases, it is necessary to have a planar substrate surface at several stages of processing the substrate because non-uniform substrate surfaces significantly increase the difficulty of forming sub-micron features or photo-patterns to within a tolerance of approximately 0.1 $\mu$m. Thus, CMP processes must typically transform a highly topographical substrate surface into a highly uniform, planar substrate surface (e.g., a "blanket surface").

In the competitive semiconductor industry, it is highly desirable to maximize the throughput of CMP processing by producing a blanket surface on a substrate as quickly as possible. The throughput of CMP processing is a function of several factors, one of which is the ability to accurately stop CMP processing at a desired endpoint. In a typical CMP process, the desired endpoint is reached when the surface of the substrate is a blanket surface and/or when enough material has been removed from the substrate to form discrete components on the substrate (e.g., shallow trench isolation areas, contacts, damascene lines, etc.). Accurately stopping CMP processing at a desired endpoint is important for maintaining a high throughput because the substrate may need to be re-polished if the substrate is "under-planarized." Accurately stopping CMP processing at the desired endpoint is also important because too much material can be removed from the substrate, and thus the substrate may be "over-polished." For example, over-polishing can cause "dishing" in shallow-trench isolation structures, or over-polishing can completely destroy a section of the substrate. Thus, it is highly desirable to stop CMP processing at the desired endpoint.

In one conventional method for determining the endpoint of CMP processing, the planarizing period of one substrate in a run is estimated using the polishing rate of previous substrates in the run. The estimated planarizing period for a particular substrate, however, may not be accurate because the polishing rate may change from one substrate to another. Thus, this method may not accurately planarize all of the substrates in a run to the desired endpoint.

In another method for determining the endpoint of CMP processing, the substrate is removed from the pad and the substrate carrier, and then a measuring device measures a change in thickness of the substrate. Removing the substrate from the pad and substrate carrier, however, is time-consuming and may damage the substrate. Thus, this method generally reduces the throughput of CMP processing.

In still another method for determining the endpoint of CMP processing, a portion of the substrate is moved beyond the edge of the pad, and an interferometer directs a beam of light directly onto the exposed portion of the substrate. The substrate, however, may not be in the same reference position each time it overhangs the pad. For example, because the edge of the pad is compressible, the substrate may not be at the same elevation for each measurement. Thus, this method may inaccurately measure the change in thickness of the wafer.

In yet another method for determining the endpoint of CMP processing, U.S. Pat. No. 5,036,015 discloses detecting the planar endpoint by sensing a change in friction between a wafer and the polishing medium. Such a change in friction may be produced by a different coefficient of friction at the wafer surface as one material (e.g., an oxide) is removed from the wafer to expose another material (e.g., a nitride). In addition to the different coefficients of friction caused by a change of material at the substrate surface, the friction between the wafer and the planarizing medium generally increases during CMP processing because more surface area of the substrate contacts the polishing pad as the substrate becomes more planar. U.S. Pat. No. 5,036,015 discloses detecting the change in friction by measuring the change in current through the platen drive motor and/or the drive motor for the substrate holder. One drawback with this method, however, is that it does not allow for endpointing within a generally homogeneous substrate that consists of a single material.

In still a further method for determining the endpoint of CMP processing, such as is disclosed in U.S. Pat. No.

5,559,428, the chemical composition of the CMP slurry is analyzed to determine when a layer of a first material has been removed to expose a layer of a second, different, material. For example, planarization may continue through the first material until the second material is exposed, at which point some of the second material is removed and enters the slurry. The second material in the slurry is identified using instrumentation such as inductively coupled plasma for atomic emission spectroscopy, and the planarization process is halted. Like the above-described technique for sensing a change in planarizing function, this technique also does not allow endpointing within a generally homogeneous substrate.

SUMMARY OF THE INVENTION

The present invention is directed toward methods and apparatuses for endpointing a planarizing process of a microelectronic substrate. In one embodiment, the microelectronic substrate includes a matrix material and an endpointing material implanted or otherwise positioned beneath a surface of the matrix material at the desired endpoint location. The apparatus may include a first portion and a second portion movable relative to each other to remove material from the microelectronic substrate positioned therebetween. The removed material may be transported to a species detector to detect the presence of the endpointing material. For example, the endpointing material may be detected by determining an atomic mass of the endpointing material, or by determining an intensity of radiation emitted by atoms of the endpointing material.

In another embodiment, the apparatus may be include a radiation source that directs impinging radiation toward the microelectronic substrate while the substrate is planarized. The apparatus may further include a detector spaced apart from the microelectronic substrate to receive radiation emitted by atoms of the substrate while the atoms remain attached to the microelectronic substrate. The endpointing material may be selected to emit radiation at a wavelength different than radiation emitted by the matrix material so that when the second material is exposed during planarization, it may be easily identified by the detector and planarization may be halted.

BRIEF DESCRIPTION OF THE DRAWINGS

FIG. 3A is a cross-sectional elevation view of a portion of a microelectronic substrate having an endpointing material in accordance with another embodiment of the invention.

FIG. 3B is a graph of the concentration of the endpointing material in the substrate shown in FIG. 3A as a function of depth beneath a surface of the substrate.

FIG. 4A is a cross-sectional elevation view of a portion of a microelectronic substrate having an endpointing material in accordance with another embodiment of the invention.

FIG. 4B is a graph of the concentration of the endpointing material in the substrate shown in FIG. 4A as a function of depth beneath a surface of the substrate.

FIG. 5A is a cross-sectional elevation view of a portion of a microelectronic substrate having adjacent layers of an endpointing material in accordance with yet another embodiment of the invention.

FIG. 5B is a graph of the concentration of the endpointing material in the substrate shown in FIG. 5A as a function of depth beneath a surface of the substrate.

FIG. 6 is a cross-sectional elevation view of a portion of a microelectronic substrate in accordance with still another embodiment of the invention.

DETAILED DESCRIPTION OF THE INVENTION

The present invention is directed toward methods and apparatuses for endpointing the planarization of a microelectronic substrate. The microelectronic substrate may include an endpointing material positioned beneath a surface of the substrate, and the apparatus may include a detector that detects the presence of the endpointing material before or after the overlaying substrate material has been removed. Many specific details of certain embodiments of the invention are set forth in the following description and in FIGS. 2–7 to provide a thorough understanding of such embodiments. One skilled in the art, however, will understand that the present invention may have additional embodiments and that they may be practiced without several of the details described in the following description.

Figure 1:
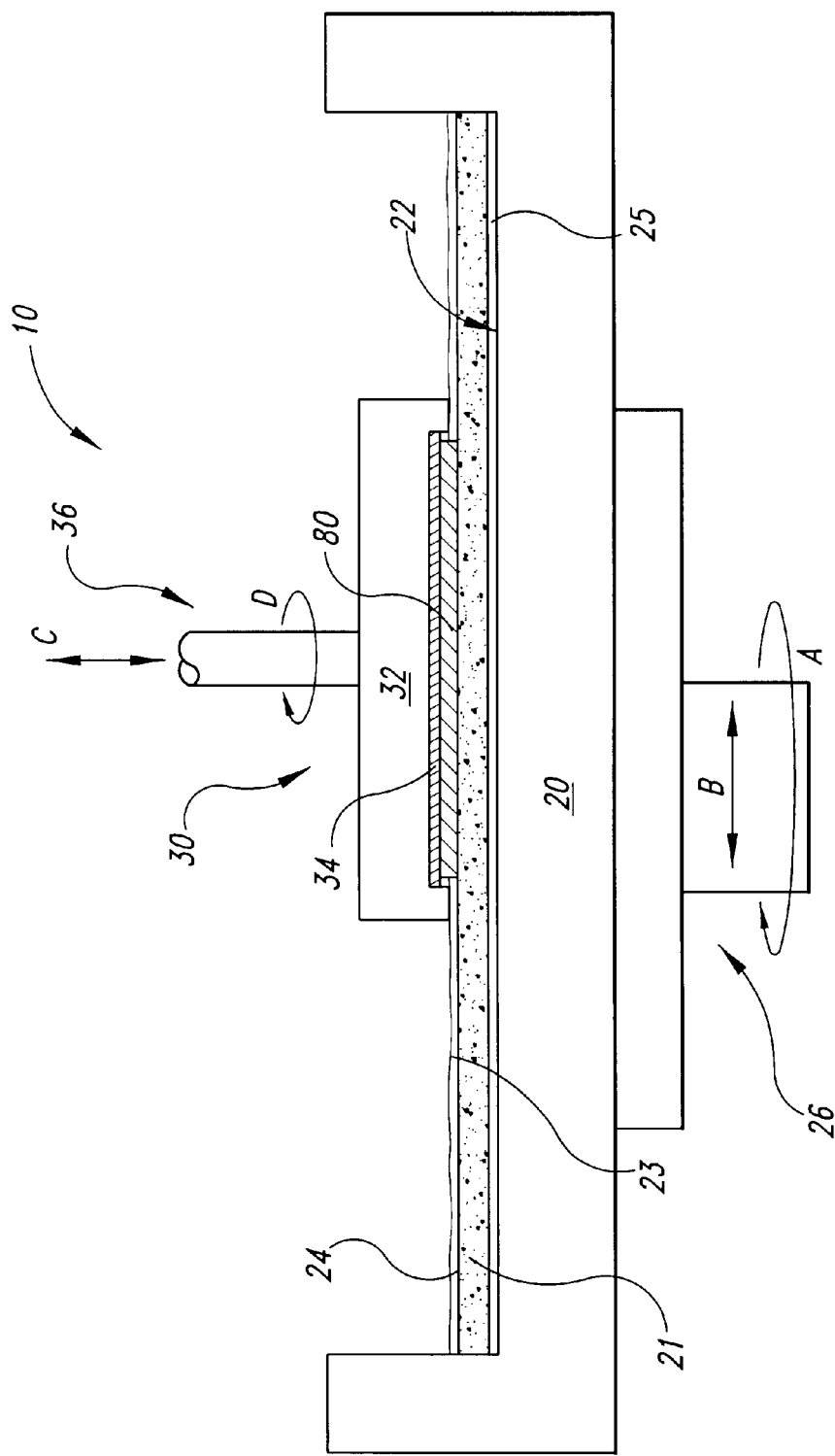
FIG. 1 is a partial cross-sectional elevation view of a chemical-mechanical planarization machine in accordance with the prior art.
Figure 2:
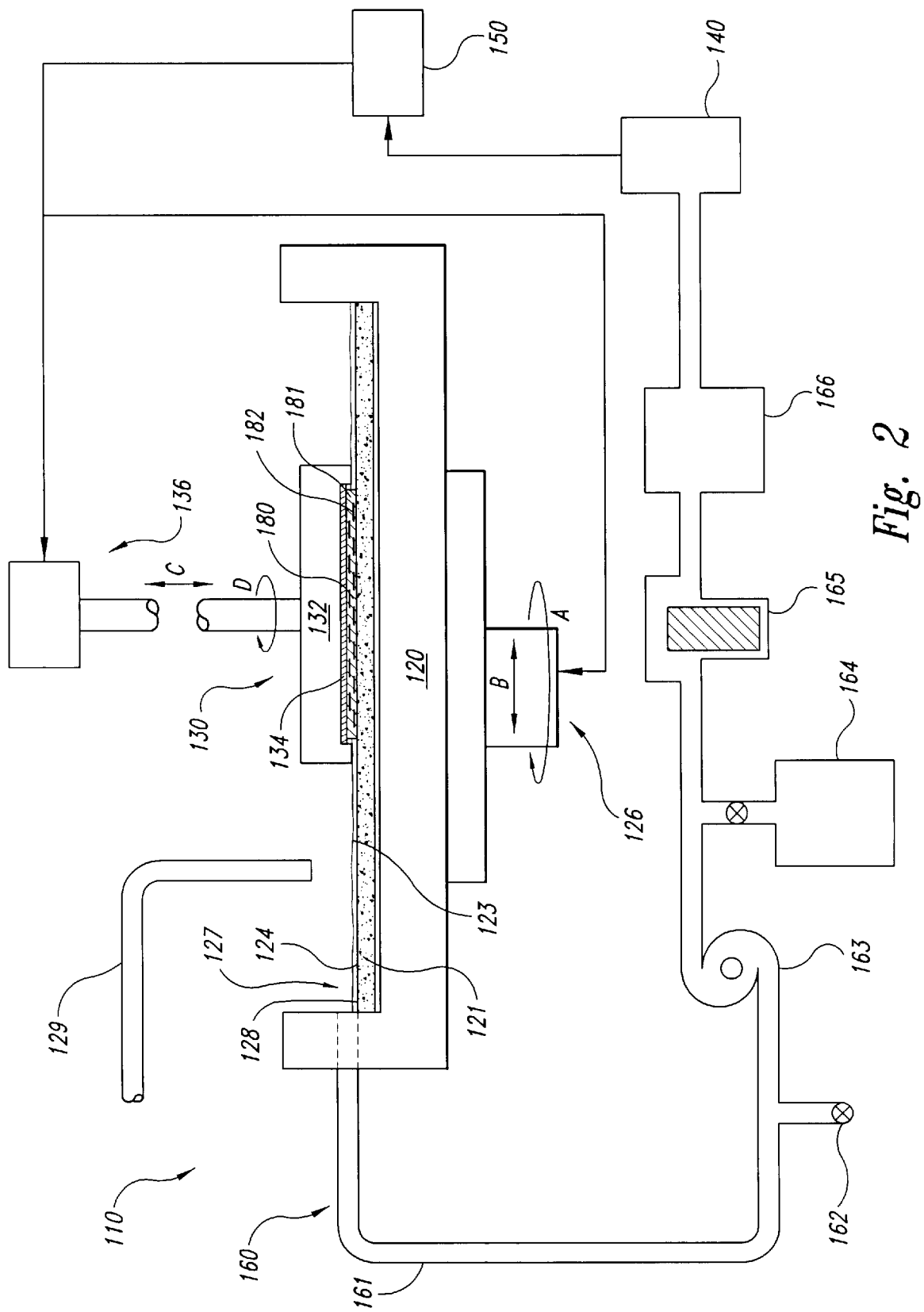
FIG. 2 is a partially schematic, partial cross-sectional elevation view of a chemical-mechanical planarization machine in accordance with an embodiment of the invention.

FIG. 2 illustrates a CMP apparatus 110 having a platen 120 and a planarizing medium 127. In the embodiment shown in FIG. 2, the planarizing medium 127 includes a polishing pad 121 releasably attached to the platen 120, and a planarizing fluid 123 disposed on a planarizing surface 124 of the polishing pad 121. The platen 120 may be movable by means of a platen drive assembly 126 that may impart rotational motion (indicated by arrow A) and/or translational motion (indicated by arrow B) to the platen 120. As was discussed above, the CMP apparatus 110 may also include a carrier assembly 130 having a substrate holder 132 and a resilient pad 134 that together press a microelectronic substrate 180 against the planarizing surface 124 of the polishing pad 121. A carrier drive assembly 136 may be coupled to the carrier assembly 130 to move the carrier assembly axially (indicated by arrow C) and/or rotationally (indicated by arrow D) relative to the platen 120.

The apparatus 110 may further include a liquid supply tube 129 that supplies the planarizing fluid 123 to the planarizing surface 124 of the polishing pad 121. The planarizing fluid 123 may be an inert, non-abrasive liquid, such as water, or the planarizing fluid may be chemically active and may further include abrasive particles to chemically and/or mechanically planarize the microelectronic substrate 180. As the carrier assembly 130 moves relative to the platen 120, the planarizing medium 127 (i.e., the platen 121 and/or the planarizing fluid 123) removes material from the microelectronic substrate 180. The removed material may include a matrix material 181 that forms the bulk of the microelectronic substrate 180 and may also include an endpointing material 182 disposed beneath the surface of the matrix material 181. For purposes of clarity, the deposits of the endpointing material 182 are shown enlarged in FIG. 2 relative to the surrounding matrix material 181. The material removed from the substrate 180 may mix with the planarizing fluid 123 to form a slurry 128 that is moved by a transport device 160 from the platen 120 to a species analyzer 140 where the slurry 128 is analyzed to determine the presence or absence of the endpointing material 182.

In one embodiment, the transport device 160 may include a closed conduit 161 coupled at one end to the platen 120, and in other embodiments, the transport device 160 may include other fluid conveyance means, such as an open channel. The conduit 161 may include a drain valve 162 to drain the slurry 128 prior to storing or maintaining components of the apparatus 110. The conduit 161 may be coupled to a pump 163 that pumps the slurry 128 toward the species analyzer 140, and the conduit may also be coupled to one or more conditioning devices that condition the slurry 128 before it reaches the species analyzer 140. For example, the conditioning devices may include a diluter 164 that dilutes the slurry 128 if the expected concentration of the endpointing material 182 may exceed the capacity of the species analyzer 140. The conditioning devices may further include a filter 165 to separate abrasive particles from the slurry 128, and/or an optional vaporizer 166 to vaporize the slurry 128 and provide gas-phase atoms to the species analyzer 140.

The species analyzer 140 may include any number of devices that can determine the presence of the endpointing material in the slurry 128 or can determine a concentration of the endpointing material 182 relative to a concentration of the matrix material 181. For example, in one embodiment, the species analyzer 140 may include a mass spectrometer, such as is available from SRC Corporation of Sunnyvale, California. The mass spectrometer may impart a charge to atoms of both the matrix material 181 and the endpointing material 182 and may pass the atoms through a magnetic field. The atoms of the endpointing material 182 may be selected to have a different atomic mass than the atoms of the matrix material 181, such that the atoms of the endpointing material 182 may be deflected by the magnetic field along a path that is different that the path followed by atoms of the matrix material 181. Accordingly, the concentration of the atoms of each type of material may be determined by measuring the number of atoms deflected along each corresponding path. For example, the number of deflected atoms may be determined electrically by measuring a current generated by the atoms as they strike a metal plate, or the number of atoms may be determined visually by observing photographic plates on which the atoms impinge. In other embodiments, other means may be used to measure the presence and/or concentration of the deflected atoms.

In an alternate embodiment, the species analyzer 140 may include a spectrum analyzer that determines the intensity of light emitted by the excited atoms at a characteristic wavelength. Accordingly, the endpointing material 182 may be selected to emit light at the characteristic wavelength, and the matrix material 181 may be selected to emit light at a wavelength other than the characteristic wavelength. The presence and/or concentration of the endpointing material 182 in the slurry may then be determined by detecting an increase in the intensity of light emitted at the characteristic wavelength. The spectrum analyzer may include conventional means, such as a laser radiation source, to excite the atoms. Similarly, conventional detectors may be used to determine the intensity of the light emitted by the excited atoms.

The species analyzer 140 may be coupled to a controller 150 which is in turn coupled to the platen drive assembly 126 and the carrier drive assembly 136. Accordingly, when the species analyzer 140 detects the endpointing material 182 in the slurry 128, it may send a control signal to the controller 150 which halts planarization of the microelectronic substrate 180 by stopping relative motion between the carrier assembly 130 and the platen 120. Because it may be desirable to halt the planarizing process as soon as the endpointing material 182 is exposed, the components of the planarizing apparatus 110 may be selected to reduce the time that elapses between exposing the endpointing material 182 and halting the planarizing process. For example, the conduit 161 may be made as short as possible to reduce fluid residence time within the conduit, and the pump 163 may be sized to pass the slurry 128 quickly through the conduit 161. The species analyzer 140 may be selected to quickly analyze the slurry 128, and the controller 150 may be selected to deliver control signals to the drive assemblies 126 and 136 in a short period of time. Accordingly, in one embodiment, the apparatus 110 may halt the planarization process within five seconds of exposing the endpointing material 182. In other embodiments, the apparatus 110 may halt the planarizing process in shorter or longer periods of time, depending on variables such as the planarizing rate and the composition of the microelectronic substrate 180.

FIG. 3A is a detailed cross-sectional elevation view of a portion of the microelectronic substrate 180 shown in FIG. 2. As shown in FIG. 3A, the endpointing material 182 is disposed beneath an upper surface 183 of the matrix material 181. The upper surface 183 may include a plurality of recesses 184 and raised features 187 that are removed to the level of the recesses 184 during planarization.

In one embodiment, the matrix material 181 may include a semiconductor material, such as silicon, tetraethylorthosilicate or borophosphate silicon glass, and in other embodiments, the matrix material 181 may include other substances. The endpointing material 182 may include tungsten, aluminum, copper, or any material that can be distinguished from the matrix material 181 with the species analyzer 140 (FIG. 2). For example, the matrix material 181 may include any silicon compound and the endpointing material 182 may include any non-silicon compound or element. In one embodiment, the endpointing material 182 may have such a negligible effect on the electrical properties of the microelectronic substrate 180 that the performance of the microelectronic substrate if none or only a portion of the endpointing material 182 is removed during planarization is unchanged from that of microelectronic substrate that consists of only the matrix material 181. In other embodiments, the endpointing material 182 may have an affect on the electrical properties of the microelectronic substrate 180 and may accordingly be left in the microelectronic substrate 180 after planarization (if the effect is beneficial) or completely removed from the microelectronic substrate 180 during planarization (if the effect is adverse).

In one embodiment, the endpointing material 182 may be implanted in the matrix material 181 by ionizing atoms of the endpointing material to create charged atoms and accelerating the charged atoms through an electric field toward the microelectronic substrate 180, as indicated by arrow E. The charged atoms have sufficient force to penetrate into the matrix material 181 to a selected depth D. The ionized atoms may accordingly form upper and lower layers 185 (shown as 185a and 185b, respectively), each having a thickness t. The upper layers 185a are positioned beneath the raised features 187 and the lower layers 185b are positioned beneath the recesses 184.

The depth D to which the endpointing material atoms penetrate may be controlled by selecting the endpointing material 182 and the matrix material 181, and by controlling the charge on the ionized endpointing material atoms and the acceleration imparted to the charged atoms. The thickness t and the concentration of the endpointing material atoms within the layers 185 may be controlled by varying the depth D as the ions are implanted and/or by controlling the time during which the microelectronic substrate 180 is exposed to the ions. For example, in one embodiment, the layers 185a and 185b may have a thickness in the range of approximately 100 Å to approximately 500 Å and may be positioned approximately 200 Å beneath the raised features 187 and the recesses 184, respectively. In other embodiments, the depth D and thickness t of the layers 185 may have other values depending on the selected endpointing material 182 and the matrix material 181, and whether or not the endpointing material 182 is to remain in the microelectronic substrate 180 after planarization. In one embodiment, the atomic concentration of the endpointing material may be in the range of approximately 0.1% to approximately 0.001% (i.e., the number of endpointing material atoms within the layers 185 may be in the range of approximately 0.1% to approximately 0.001% of the number of matrix material atoms in the layers 185). In other embodiments, the concentration of endpointing material atoms may have other values, depending on the sensitivity of the species analyzer 140 (FIG. 2.)

FIG. 3B is a graph of the concentration of the endpointing material 182 as a function of depth beneath the surface 183 of the microelectronic substrate 180 shown in FIG. 3A. As shown in FIG. 3B, the concentration profile has two spikes 186 (shown as 186a and 186b) corresponding to the upper and lower layers 185a and 185b, respectively (FIG. 3A). Accordingly, in one method of operation, the microelectronic substrate 180 shown in FIG. 3A is placed with the upper surface 183 facing downward against the polishing pad 121 shown in FIG. 2. The microelectronic substrate 180 is moved relative to the polishing pad 121 to remove material from the substrate, and the material is conveyed by the transport device 160 (FIG. 2) to the species analyzer 140 (FIG. 2). As the microelectronic substrate 180 is planarized, the species analyzer 140 may produce a concentration profile similar to that shown in FIG. 3B, based on the atomic mass or characteristic wavelength of atoms in the slurry 128, as discussed above with reference to FIG. 2. The apparatus 110 (FIG. 2) continues to planarize the substrate 180 after the species analyzer 140 detects upper layer 185a (corresponding to the upper spike 186a), until the species analyzer 140 detects the lower layer 185b (corresponding to the lower spike 186b). Where the endpointing material 182 has a negligible or beneficial effect on the electrical properties of the microelectronic substrate 180, the planarizing process may be halted before the lower layer 185b of the endpointing material 182 is completely removed. Alternatively, where the endpointing material 182 has an adverse effect on the electrical properties of the microelectronic substrate 180, planarization may continue until the endpointing material 182 has been completely removed.

One advantage of an embodiment of the method and apparatus described above with respect to FIGS. 2–3B is that the planarizing process may be accurately halted after material has been removed from a generally homogeneous microelectronic substrate 180. Unlike some conventional methods, which may require a relatively large, continuous layer of material different in composition than that of the substrate to detect the endpoint, the present method may be used to endpoint a microelectronic substrate 180 that is homogeneous except for the addition of a small amount of the endpointing material 182.

Another advantage is that the endpoint may be determined in situ, without removing the substrate 180 from the planarizing apparatus 110. This is so because the transport means 160 and the species analyzer 140 may operate without interrupting or otherwise affecting the planarizing process. Still another advantage is that the position of the endpoint may be selected by controlling the depth at which the endpointing material 182 is deposited in the microelectronic substrate 180. Furthermore, the microelectronic substrate 180 may be manufactured with several layers 185, each positioned at a different depth beneath the surface 183. The different depths may result from the topography of the surface 183, or alternatively, the implanting process may be controlled to position each layer 185 at a selected depth beneath the surface 183. During planarization, one of the layers 185 may then be selected to correspond to the desired endpoint.

FIG. 4A is a cross-sectional elevation view of a portion of a microelectronic substrate 280 having two types of recesses 284, shown in FIG. 4A as shallow recesses 284a and deep recesses 284b, each positioned at a different depth beneath the upper surface 283. Accordingly, the endpointing material 282 may form three layers 285 (shown as 285a, 285b, and 285c) when the endpointing material is implanted from above the upper surface 283. Upper layers 285a may be positioned directly beneath raised features 287, intermediate layers 285b may be positioned beneath the shallow recesses 284a, and lower layers 285c may be positioned beneath the deep recesses 284b. The concentration profile of the endpointing material 282 is shown in FIG. 4B as a function of depth beneath the upper surface 283. As shown in FIG. 4B, the profile includes three spikes 286 (shown as 286a, 286b, and 286c), corresponding to the respective layers 285.

In operation, the microelectronic substrate 280 may be planarized until the lowermost layer 285c (corresponding to the lowermost spike 286c) has been detected. As discussed above with respect to FIGS. 2–3B, the lowermost layer 285c may be removed or retained, depending upon the characteristics of the endpointing material 282. Where the number of types of recesses 284 in the upper surface of the microelectronic substrate is known in advance, the planarizing apparatus 110 (FIG. 2) may be configured or programmed to halt the planarizing process automatically upon detecting the lowermost layer 285c of endpointing material 282. For example, the planarizing apparatus 110 may be programmed to stop planarization after detecting two concentration spikes 186 (e.g., for the microelectronic substrate 180 shown in FIG. 3A), or may be halted after detecting three concentration spikes 286 (for the microelectronic substrate 280 shown in FIG. 4A). In other embodiments, the planarizing apparatus 110 may be programmed to halt planarization based on a different number of concentration spikes, depending upon the topography of the particular type of microelectronic substrate. This method of operation may be particularly advantageous where, as may often be the case, the number of types of recesses is known for a particular substrate manufacturing process or a particular batch of microelectronic substrates.

FIG. 5A is a cross-sectional elevation view of a portion of a microelectronic substrate 380 having adjacent layers 385a and 385b positioned beneath raised features 387 and recesses 384, respectively. As shown in FIG. 5A, each of the layers 385 has a thickness $t_1$ that is greater than a distance d between the upper surface 383 and the bottoms of the recesses 384. Accordingly, the layers 385a and 385b overlap in the sense that they are both present over a certain range of depths beneath the upper surface 383 of the microelectronic substrate 380. As a result, the concentration profile of the endpointing material 382 in the microelectronic substrate 380 has a single continuous spike 386, as shown in FIG. 5B.

An advantage of the overlapping layers 385a and 385b shown in FIG. 5A is that an effectively continuous layer of endpointing material 382 may be implanted beneath the upper surface 383 of the microelectronic substrate 380 by making the thickness $t_1$ of the layers 385 greater than the depth d of the recesses 384. Accordingly, a user need not track the number of layers 385 that must be detected before reaching the endpoint. Conversely, an advantage of the substrates 180 and 280 shown in FIGS. 3A and 4A is that the user need only know the number of types of recesses for each substrate and need not know the depth of the recesses beneath the substrate upper surface.

FIG. 6 is a cross-sectional elevation view of a portion of a microelectronic substrate 480 having a smooth, continuous layer 485 of an endpointing material 482. Where the upper surface 483 of the microelectronic substrate 480 is generally flat, the layer 485 may be formed by ion implantation, as was discussed above generally with reference to FIG. 2. Alternatively, the microelectronic substrate 480 may be formed by depositing the layer 485 between a lower layer 481a and an upper layer 48b of the matrix material 481. The layer 485 may accordingly be formed using chemical vapor deposition, sputtering, or other conventional methods.

An advantage of the microelectronic substrate 480 shown in FIG. 6 is that it may be planarized without knowledge of the number or size of any surface features. Conversely, an advantage of the substrates shown in FIGS. 3A, 4A and 5A is that it may be easier to implant the endpointing material in the matrix material than it is to separately form the upper and lower layers 481a, 481b of the matrix material 481 shown in FIG. 6.

Figure 7:
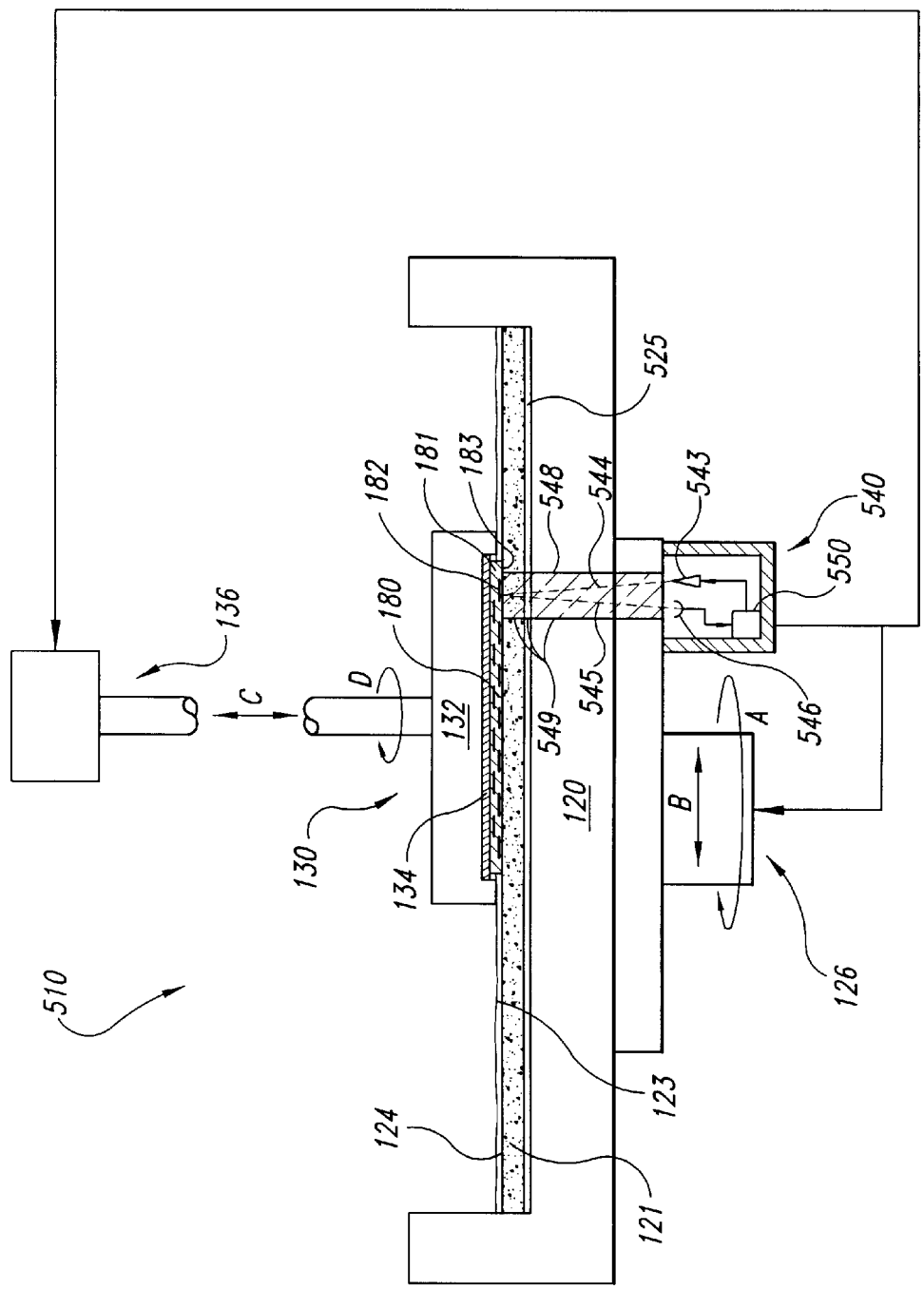
FIG. 7 is a partially schematic, partial cross-sectional elevation view of a chemical-mechanical planarization machine in accordance with another embodiment of the invention.

FIG. 7 is a partially schematic, partial cross-sectional elevation view of a CMP machine 510 having a species detector 540 that generates and detects radiation in accordance with another embodiment of the invention. The species analyzer 540 may include a radiation source 543 (for example, a laser) that generates incident radiation 544 (for example, laser radiation) and directs the incident radiation toward the microelectronic substrate 180. Accordingly, the platen 120, polishing pad 121, and an under pad 525 may have a series of aligned apertures 549 that extend continuously from the radiation source 543 to the upper surface 183 of the microelectronic substrate 180. The apertures 549 may be filled with a solid window 548 formed from a quartz crystal or other transparent or nearly transparent material.

The species analyzer 540 may further include a radiation detector 546 positioned beneath the window 548 to receive radiation 545 emitted by the microelectronic substrate 180. The radiation detector 546 and radiation source 543 may be controlled by a controller 550 that also controls operation of the platen drive assembly 126 and the carrier drive assembly 136. The radiation detector 546 may be tuned to receive just the radiation emitted by the endpointing material 182. Accordingly, the endpointing material 182 may be selected to emit radiation at a wavelength different that radiation emitted by the matrix material 181. Alternatively, the radiation detector 546 may detect a range of radiations but may display or send to the controller 550 signals corresponding only to the selected emitted radiation. Furthermore, the radiation source 543 may be selected to preferentially excite atoms of the endpointing material 182, rather than the matrix material 181. Alternatively, the radiation source 543 may be selected to preferentially excite atoms of the matrix material 181.

In operation, the radiation source 543 is activated to direct the incident radiation 544 toward the upper surface 183 of the substrate 180. The incident radiation 544 may penetrate the upper surface 183 to excite atoms within the microelectronic substrate 180 to a higher energy level. As the atoms descend from the higher energy level, they produce the emitted radiation 545 that passes back through the window 548 to the radiation detector 546.

As planarization progresses, matrix material 181 between the endpointing material 182 and the upper surface 183 is removed, increasing the amount of incident radiation 544 impinging on the endpointing material 182, and accordingly increasing the emitted radiation 545 emitted by the endpointing material and detected by the radiation detector 546. In fact, depending on the intensity of the incident radiation 544 and/or the characteristics of the matrix material 181, the incident radiation may penetrate enough of the matrix material 181 to excite the endpointing material atoms even before planarization begins. As material is removed from the microelectronic substrate 180, the portion of the emitted radiation 545 corresponding to the endpointing material 182 and detected by the detector 546 continues to increase until the endpointing material 182 is completely exposed, and then decreases as the endpointing material 182 is removed. The controller 550 may halt the planarizing process when the endpointing material 182 is detected, or after the endpointing material 182 has been removed, as was discussed above with reference to FIG. 2.

One advantage of the CMP machine 510 shown in FIG. 7 is that it does not require removing a slurry from the platen 120. Accordingly, the mechanical complexity of the CMP machine 510 may be reduced. Furthermore, the time between the exposure and the detection of the endpointing material 182 may be reduced because the endpointing material is not transported away from the platen 120 for analysis. Another advantage is that the presence of the endpointing material 182 may be detected before planarization begins because the incident radiation 544 may penetrate the upper surface 183 of the microelectronic substrate 180. Accordingly, a user can continuously monitor the proximity of the endpointing material 182 to the upper surface 183.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. In a planarizing process of a microelectronic substrate that includes first and second substances, the second substance being beneath a surface of the microelectronic substrate, a method of endpointing the planarizing process, comprising:

removing material from the microelectronic substrate to expose the second substance;

detecting the second substance while removing material from the microelectronic substrate by detecting an intensity of light at a selected wavelength emitted by atoms of the second substance while the second substance remains implanted in the microelectronic substrate; and removing a sufficient amount of the second substance from the microelectronic substrate such that electrical characteristics of the microelectronic substrate are generally the same as those of the microelectronic substrate without the second substance.

2. The method of claim 1, further comprising implanting the second substance beneath the surface of the microelectronic substrate.

3. The method of claim 2 wherein atoms of the second substance have an electrical charge and implanting the second substance includes positioning the atoms of the second substance proximate to a like electrical charge to accelerate the atoms of the second substance toward the microelectronic substrate.

4. The method of claim 1, further comprising:
applying the second substance to a surface of the first substance; and
applying an additional amount of the first substance to the second substance.

5. The method of claim 4 wherein the act of applying the second substance includes depositing the second substance on the surface of the first substance while the second substance is a vapor.

6. A method of planarizing a surface of a microelectronic substrate, comprising:
placing an endpointing substance in the substrate beneath the surface of the substrate solely for the purpose of endpointing the planarizing of the substrate;
abrasively removing material from the substrate at least to the level of the endpointing substance;
detecting when the endpointing substance is being abrasively removed along with the abrasive removal of the material from the substrate by detecting an intensity of light at a selected wavelength emitted by atoms of the second substance while the second substance remains implanted in the microelectronic substrate; and
terminating the abrasive removal of the material from the substrate responsive to detecting the abrasive removal of the endpointing substance.

7. The method of claim 6 wherein the abrasive removal of material from the substrate occurs in the presence of a planarizing fluid, and wherein the act of detecting the endpointing substance comprises analyzing the planarizing fluid to detect the presence of the endpointing substance in the planarizing fluid.

8. The method of claim 6 wherein the abrasive removal of material from the substrate includes removing some of the endpointing substance.

9. The method of claim 6 wherein the abrasive removal of material from the substrate includes removing approximately all of the endpointing substance.

10. In a planarizing process of a microelectronic substrate that includes a first substance, a method of endpointing the planarizing process, comprising:
incorporating an amount of a second substance into the microelectronic substrate by implanting the second substance in the first substance and beneath a surface of the microelectronic substrate;
reducing a thickness of the microelectronic substrate by removing material from the microelectronic substrate to expose the second substance;
detecting the second substance by analyzing material of the microelectronic substrate by detecting an intensity of light at a selected wavelength emitted by atoms of the second substance while the second substance remains implanted in the microelectronic substrate; and
further reducing the thickness of the microelectronic substrate by removing approximately the entire amount of the second substance from the microelectronic substrate.

11. The method of claim 10 wherein atoms of the second substance have an electrical charge and implanting the second substance includes positioning the atoms of the second substance proximate to a like electrical charge to accelerate the atoms of the second substance toward the microelectronic substrate.

12. The method of claim 10 wherein implanting the second substance includes forming a layer of the second substance within the microelectronic substrate.

13. The method of claim 12 wherein forming a layer includes forming a layer having a thickness in the range of approximately 100 Angstroms to approximately 500 Angstroms.

14. The method of claim 12 wherein forming a layer includes forming a layer centered at approximately 200 Angstroms beneath the surface of the microelectronic substrate.

15. The method of claim 12 wherein forming a layer includes forming a layer having a number of atoms of the second substance in the range of approximately 0.1% to approximately 0.001% of the number of atoms of the first substance.

16. The method of claim 10 wherein detecting the second substance includes detecting a layer of the second substance.

17. The method of claim 10 wherein the surface of the microelectronic substrate is a first surface, the microelectronic substrate having a second surface opposite the first surface, further wherein the first surface includes a first portion having a first height relative to the second surface and a second portion having a second height relative to the second surface different than the first height, further wherein the act of implanting the second substance includes implanting a first amount of the second substance at a first selected depth beneath the surface of the microelectronic substrate at the first portion and implanting a second amount of the second substance at a second selected depth beneath the surface of the microelectronic device at the second portion, the first and second depths being approximately equal.

18. The method of claim 17, further comprising ceasing to remove material from the microelectronic substrate after detecting the first and second portions of the second substance.

19. The method of claim 10, further comprising ceasing to remove material from the microelectronic substrate after detecting the second substance.

20. In a planarizing process of a microelectronic substrate that includes a first substance, a method of endpointing the planarizing process, comprising:
incorporating a second substance into the microelectronic substrate;
removing material from the microelectronic substrate to expose the second substance;
removing at least a portion of the second substance from the microelectronic substrate; and
detecting the portion of the second substance by detecting an intensity of light at a selected wavelength emitted by atoms of the second substance while the second substance remains implanted in the microelectronic substrate.

21. The method of claim 20 wherein incorporating the second substance includes implanting the second substance beneath a surface of the first substance.

22. The method of claim 21 wherein atoms of the second substance have an electrical charge and the act of implanting the second substance includes positioning the atoms of the second substance proximate to a like electrical charge to accelerate the atoms of the second substance toward the microelectronic substrate.

23. The method of claim 22 wherein incorporating the second substance includes:
applying the second substance to a surface of the first substance; and applying an additional amount of the first substance to the second substance.

24. The method of claim 23 wherein the act of applying the second substance includes depositing the second substance on the surface of the first substance while the second substance is in vapor form.

25. The method of claim 20 wherein removing material from the microelectronic substrate includes engaging a planarizing liquid with the microelectronic substrate and removing the second substance from the microelectronic substrate includes mixing a portion of the second substance with the planarizing liquid, further comprising vaporizing at least some of the planarizing liquid and the portion of the second substance in the planarizing liquid.

26. The method of claim 20 wherein the surface of the microelectronic substrate is a first surface, the microelectronic substrate having a second surface opposite the first surface, further wherein the first surface includes a first portion having a first height relative to the second surface and a second portion having a second height relative to the second surface different than the first height, further wherein the act of implanting the second substance includes implanting a first amount of the second substance at a first selected depth beneath the surface of the microelectronic substrate at the first portion and implanting a second amount of the second substance at a second selected depth beneath the surface of the microelectronic device at the second portion, the first and second depths being approximately equal.

27. The method of claim 26, further comprising ceasing to remove material from the microelectronic substrate after detecting the first and second portions of the second substance.

28. The method of claim 20, further comprising ceasing to remove material from the microelectronic substrate after detecting the second substance.

29. In a planarizing process of a microelectronic substrate that includes a first substance, a method of endpointing the planarizing process, comprising:
    implanting a second substance beneath a surface of the microelectronic substrate;
    removing material from the microelectronic substrate to expose the second substance;
    removing at least a portion of the second substance; and
    detecting light emitted by atoms of the second substance at a selected wavelength while the second substance remains implanted in the microelectronic substrate.

30. The method of claim 29 wherein the act of detecting light emitted by atoms of the second substance includes detecting an intensity of the light at a selected wavelength.

31. The method of claim 29, further comprising comparing an intensity of light emitted by atoms of the second substance to an intensity of light emitted by atoms of the first substance.

32. The method of claim 29, further comprising exciting atoms of the second substance.

33. The method of claim 29 wherein removing material from the microelectronic substrate includes exposing the microelectronic substrate to a planarizing liquid and removing the second substance from the microelectronic substrate includes mixing a portion of the second substance with the planarizing liquid, further comprising vaporizing at least some of the planarizing liquid and the portion of the second substance in the planarizing liquid.

34. The method of claim 29 wherein atoms of the second substance have an electrical charge and implanting the second substance includes positioning the atoms of the second substance proximate to a like electrical charge to accelerate the atoms of the second substance toward the microelectronic substrate.

35. The method of claim 29 wherein the surface of the microelectronic substrate is a first surface, the microelectronic substrate having a second surface opposite the first surface, further wherein the first surface includes a first portion having a first height relative to the second surface and a second portion having a second height relative to the second surface different than the first height, further wherein the act of implanting the second substance includes implanting a first amount of the second substance at a first selected depth beneath the surface of the microelectronic substrate at the first portion and implanting a second amount of the second substance at a second selected depth beneath the surface of the microelectronic device at the second portion, the first and second depths being approximately equal.

36. The method of claim 35, further comprising removing the first and second portions of the first surface.

37. The method of claim 35, further comprising ceasing to remove material from the microelectronic substrate after detecting the first and second portions of the second substance.

38. The method of claim 29, further comprising ceasing to remove material from the microelectronic substrate after detecting the second substance.

39. In a planarizing process of a microelectronic substrate that includes a first substance, a method of endpointing the planarizing process, comprising:
    implanting a second substance beneath a surface of the microelectronic substrate;
    directing laser radiation toward the surface of the microelectronic substrate and exciting atoms impinged by the laser radiation
    removing material from the microelectronic substrate to expose the second substance;
    detecting the second substance by determining an intensity of light emitted by excited atoms of the second substance while the second substance is attached to the microelectronic substrate; and
    removing a sufficient amount of the second substance from the microelectronic substrate such that electrical characteristics of the microelectronic substrate are generally the same as those of the microelectronic substrate without the second substance.

40. The method of claim 39, further comprising selecting a wavelength of the laser radiation to excite atoms of the first substance to a first selected level and excite atoms of the second substance to a second selected level, the second selected level being higher than the first selected level.

41. The method of claim 39 wherein the act of removing material from the microelectronic substrate includes exposing the microelectronic substrate to a planarizing liquid and the step of removing the second substance from the microelectronic substrate includes mixing a portion of the second substance with the planarizing liquid, further comprising vaporizing at least some of the planarizing liquid and the portion of the second substance in the planarizing liquid.

42. The method of claim 39 wherein atoms of the second substance have an electrical charge and implanting the second substance includes positioning the atoms of the second substance proximate to a like electrical charge to accelerate the atoms of the second substance toward the microelectronic substrate.

43. The method of claim 39 wherein the surface of the microelectronic substrate is a first surface, the microelectronic substrate having a second surface opposite the first surface, further wherein the first surface includes a first portion having a first height relative to the second surface and a second portion having a second height relative to the second surface different than the first height, further wherein the act of implanting the second substance includes implanting a first amount of the second substance at a first selected depth beneath the surface of the microelectronic substrate and implanting a second amount of the second substance at the first portion and at a second selected depth beneath the surface of the microelectronic device at the second portion, the first and second depths being approximately equal.

44. The method of claim 43, further comprising removing material from the first and second portions of the first surface.

45. The method of claim 43, further comprising ceasing to remove material from the microelectronic substrate after detecting the first and second portions of the second substance.

46. The method of claim 39, further comprising ceasing to remove material from the microelectronic substrate after detecting the second substance.

47. A microelectronic substrate, comprising:
a semiconductor material; and
an endpointing material positioned beneath a surface of the semiconductor material, the amount of endpointing material in the semiconductor material being such that electrical characteristics of the semiconductor material with the endpointing material positioned beneath the surface of the semiconductor material are generally the same as electrical properties of the semiconductor material without the endpointing material.

48. The substrate of claim 47 wherein the endpointing material includes a layer of endpointing material atoms located a selected distance beneath the surface of the semiconductor material.

49. The substrate of claim 47 wherein the semiconductor material includes silicon and the endpointing material is selected from tungsten, copper and aluminum.

50. The substrate of claim 47 wherein the semiconductor material is selected from tetraethylorthosilicate and borophosphate silicon glass and the endpointing material does not include silicon.

51. The substrate of claim 47 wherein the semiconductor material includes a first substance having a first atomic mass and the endpointing material includes a second substance having a second atomic mass different than the first atomic mass.

52. The substrate of claim 47 wherein the semiconductor material includes first atoms that emit light at a first characteristic wavelength and the endpointing material includes second atoms that emit light at a second characteristic wavelength that is different than the first characteristic wavelength.

53. The substrate of claim 47 wherein the semiconductor material includes first atoms that emit light having a first intensity when impinged by laser radiation at a selected radiation, and the endpointing material includes second atoms that emit light having a second intensity when impinged by the selected laser radiation, the first intensity being different than the second intensity.

54. The substrate of claim 47 wherein the endpointing material includes ionized atoms.

55. An apparatus for detecting the endpoint of a planarizing process of a microelectronic substrate having a first substance and a second substance, the second substance being beneath a surface of the microelectronic substrate, the apparatus comprising:

a planarizing device having a first portion and a second portion movable relative to the first portion to remove material from the microelectronic substrate positioned therebetween, the material including atoms of the first and second substances;

transport means to move the material from the planarizing device; and a mass spectrometer coupled to the transport means to receive the material and detect the atomic mass of the second substance.

56. The apparatus of claim 55, further comprising a vaporizer having an inlet coupled to the transport means to receive the material, a heat source to vaporize the atoms of the first and second materials and form a vapor, and an outlet coupled to the mass spectrometer.

57. The apparatus of claim 55, further comprising a fluid source in fluid communication with the platen to provide fluid to the platen during planarization of the microelectronic substrate, wherein the transport means includes a conduit coupled between the platen and the mass spectrometer to move the fluid and the material removed from the microelectronic substrate to the mass spectrometer.

58. The apparatus of claim 55, further comprising a controller operatively coupled to the planarizing device and the mass spectrometer to control motion of the planarizing device upon receiving a control signal from the mass spectrometer.

59. The apparatus of claim 55 wherein the polishing medium includes a polishing pad having abrasive particles that are removed from the polishing pad during planarization, further comprising:
a fluid source in fluid communication with the platen to provide fluid to the platen; and
a filter coupled to the transport means between the platen and the mass spectrometer to remove at least a portion of the abrasive particles from the fluid.

60. An apparatus for detecting the endpoint of a planarizing process of a microelectronic substrate having a first substance and a second substance implanted in the first substance, comprising:
a planarizing device having a first portion and a second portion movable relative to the first portion to remove material from the microelectronic substrate, the material including atoms of the first and second substances;
a source of impinging radiation located proximate to the planarizing device and having an aperture to direct the impinging radiation toward the microelectronic device; and
a detector spaced apart from the microelectronic device to receive emitted radiation emitted by atoms of the microelectronic substrate while the atoms are attached to the microelectronic substrate.

61. The apparatus of claim 60 wherein one of the first and second portions of the planarizing device includes a platen having a polishing pad adjacent thereto and the other of the first and second portions of the planarizing device includes a carrier that releasably engages the microelectronic substrate with the polishing pad, the platen having a first aperture and the polishing pad having a second aperture aligned with the first aperture to transmit the impinging radiation to the microelectronic substrate and transmit the emitted radiation to the radiation detector.

62. The apparatus of claim 61, further comprising a solid transparent material in the aperture.

63. The apparatus of claim 62 wherein the solid transparent material includes a crystal.

64. The apparatus of claim 60, further comprising a controller operatively coupled to the planarizing device and the detector to control motion of the planarizing device upon receiving a control signal from the detector.

65. In a planarizing process of a microelectronic substrate that includes a first substance, a method of endpointing the planarizing process, comprising:

incorporating an amount of a second substance into the microelectronic substrate by implanting the second substance in the first substance and beneath a surface of the microelectronic substrate;

reducing a thickness of the microelectronic substrate by removing material from the microelectronic substrate to expose the second substance;

detecting the second substance by analyzing material of the microelectronic substrate by detecting an intensity of light at a selected wavelength emitted by atoms of the second substance present in a slurry, a vapor or in a matrix of the substrate by comparing an intensity of light emitted by atoms of the second substance to an intensity of light emitted by atoms of the first substance; and further reducing the thickness of the microelectronic substrate by removing approximately the entire amount of the second substance from the microelectronic substrate.

66. The method of claim 65 wherein atoms of the second substance have an electrical charge and implanting the second substance includes positioning the atoms of the second substance proximate to a like electrical charge to accelerate the atoms of the second substance toward the microelectronic substrate.

67. The method of claim 65 wherein implanting the second substance includes forming a layer of the second substance within the microelectronic substrate.

68. The method of claim 67 wherein forming a layer includes forming a layer having a thickness in the range of approximately 100 Angstroms to approximately 500 Angstroms.

69. The method of claim 67 wherein forming a layer includes forming a layer centered at approximately 200 Angstroms beneath the surface of the microelectronic substrate.

70. The method of claim 67 wherein forming a layer includes forming a layer having a number of atoms of the second substance in the range of approximately 0.1% to approximately 0.001% of the number of atoms of the first substance.

71. The method of claim 65 wherein detecting the second substance includes detecting an intensity of light emitted by atoms of the second substance while the second substance remains implanted in the microelectronic substrate.

72. The method of claim 65 wherein detecting the second substance includes detecting a layer of the second substance.

73. The method of claim 65 wherein the surface of the microelectronic substrate is a first surface, the microelectronic substrate having a second surface opposite the first surface, further wherein the first surface includes a first portion having a first height relative to the second surface and a second portion having a second height relative to the second surface different than the first height, further wherein the act of implanting the second substance includes implanting a first amount of the second substance at a first selected depth beneath the surface of the microelectronic substrate at the first portion and implanting a second amount of the second substance at a second selected depth beneath the surface of the microelectronic device at the second portion, the first and second depths being approximately equal.

74. The method of claim 73, further comprising ceasing to remove material from the microelectronic substrate after detecting the first and second portions of the second substance.

75. The method of claim 65, further comprising ceasing to remove material from the microelectronic substrate after detecting the second substance.

76. The method of claim 65 wherein the first substance includes at least one of tetraethylorthosilicate and borophosphate silicon glass, further comprising selecting the second substance from tungsten, aluminum and copper.

77. In a planarizing process of a microelectronic substrate that includes a first substance of tetraethylorthosilicate and borophosphate silicon glass a method of endpointing the planarizing process, comprising:

incorporating an amount of a second substance selected from the group consisting of tungsten, aluminum and copper into the microelectronic substrate by implanting the second substance into the first substance and beneath a surface of the microelectronic substrate;

reducing a thickness of the microelectronic substrate by removing material from the microelectronic substrate to expose the second substance;

detecting the second substance by analyzing material of the microelectronic substrate by detecting an intensity of light at a selected wavelength emitted by atoms of the second substance present in a slurry, a vapor or in a matrix of the; and further reducing the thickness of the microelectronic substrate by removing approximately the entire amount of the second substance from the microelectronic substrate.

78. The method of claim 77 wherein atoms of the second substance have an electrical charge and implanting the second substance includes positioning the atoms of the second substance proximate to a like electrical charge to accelerate the atoms of the second substance toward the microelectronic substrate.

79. The method of claim 77 wherein implanting the second substance includes forming a layer of the second substance within the microelectronic substrate.

80. The method of claim 79 wherein forming a layer includes forming a layer having a thickness in the range of approximately 100 Angstroms to approximately 500 Angstroms.

81. The method of claim 79 wherein forming a layer includes forming a layer centered at approximately 200 Angstroms beneath the surface of the microelectronic substrate.

82. The method of claim 79 wherein forming a layer includes forming a layer having a number of atoms of the second substance in the range of approximately 0.1% to approximately 0.001% of the number of atoms of the first substance.

83. The method of claim 77 wherein the detecting includes comparing an intensity of light emitted by atoms of the second substance to an intensity of light emitted by atoms of the first substance.

84. The method of claim 77 wherein detecting the second substance includes detecting a layer of the second substance.

85. The method of claim 77 wherein the surface of the microelectronic substrate is a first surface, the microelectronic substrate having a second surface opposite the first surface, further wherein the first surface includes a first portion having a first height relative to the second surface and a second portion having a second height relative to the second surface different than the first height, further wherein the act of implanting the second substance includes implanting a first amount of the second substance at a first selected depth beneath the surface of the microelectronic substrate at the first portion and implanting a second amount of the second substance at a second selected depth beneath the surface of the microelectronic device at the second portion, the first and second depths being approximately equal.

86. The method of claim 85, further comprising ceasing to remove material from the microelectronic substrate after detecting the first and second portions of the second substance.

87. The method of claim 77, further comprising ceasing to remove material from the microelectronic substrate after detecting the second substance.

\* \* \* \* \*

UNITED STATES PATENT AND TRADEMARK OFFICE
CERTIFICATE OF CORRECTION

PATENT NO.    : 6,323,046 B1
DATED         : November 27, 2001
INVENTOR(S)   : Vishnu K. Agarwal It is certified that error appears in the above-identified patent and that said Letters Patent is hereby corrected as shown below:

Column 12,
Line 63, "claim 22 wherein" should read -- claim 20 wherein --

Column 15, lines 22-67, Column 16, and Column 17, lines 1-4,
Please delete Claims 47 through 64.

Column 18,
Line 28, "matrix of the; and" should read -- matrix of the substrate; and --

Signed and Sealed this

Eleventh Day of March, 2003

JAMES E. ROGAN
*Director of the United States Patent and Trademark Office*